United States Patent [19]

Chai et al.

[11] 4,359,720
[45] Nov. 16, 1982

[54] ENVIRONMENTALLY SEALED VARIABLE CAPACITANCE APPARATUS

[75] Inventors: Thomas Y. Chai; Franz S. Reisch, both of Freeport, Ill.; M. T. Wu, Madison, Wis.

[73] Assignee: Honeywell Inc., Minneapolis, Minn.

[21] Appl. No.: 259,301

[22] Filed: Apr. 29, 1981

[51] Int. Cl.³ .......................... G08C 9/02; H03K 17/96
[52] U.S. Cl. .................................................. 340/365 C
[58] Field of Search ...... 340/365 C, 365 R, 146.3 SY; 235/451; 178/18, 19; 179/90 K; 200/46

[56] References Cited

U.S. PATENT DOCUMENTS

| | | | |
|---|---|---|---|
| 3,660,838 | 5/1972 | Gove et al. | 340/365 C |
| 3,797,630 | 3/1974 | Zilkha | 340/365 C |
| 3,921,166 | 11/1975 | Volpe | 340/365 C |
| 3,921,167 | 11/1975 | Fox | 340/365 C |
| 3,951,250 | 4/1976 | Pointon et al. | 340/365 C |
| 3,974,332 | 8/1976 | Abe et al. | 340/365 C |
| 4,163,222 | 7/1979 | Gove | 340/365 C |
| 4,194,083 | 3/1980 | Abe et al. | 178/18 |
| 4,234,871 | 11/1980 | Guglielmi et al. | 340/365 C |

FOREIGN PATENT DOCUMENTS

| | | | |
|---|---|---|---|
| 2822847 | 11/1978 | Fed. Rep. of Germany | 340/365 C |
| 2027209 | 2/1980 | United Kingdom | |

Primary Examiner—Thomas A. Robinson
Attorney, Agent, or Firm—Charles L. Rubow

[57] ABSTRACT

An environmentally sealed key actuatable capacitively coupled circuit board is disclosed comprising first and second flexible dielectric sheets having electrically conductive patterns thereon which form an array of capacitors and connecting matrix of conductors. A spacer is sealed between the sheets and the patterns on the sheets include a first array of capacitor plates on an inner surface of the first sheet and a second array of capacitor plates on the outer surface of the second sheet. A third array of floating capacitor plates is formed by a third pattern on the inner surface of the second sheet.

23 Claims, 3 Drawing Figures

ENVIRONMENTALLY SEALED VARIABLE CAPACITANCE APPARATUS

BACKGROUND OF THE INVENTION

The invention disclosed herein relates generally to variable capacitance apparatus, and more particularly to such apparatus embodied in an environmentally sealed circuit board for use in capacitively-coupled keyboards.

Capacitive keyboards are well known in the field of data input devices for information handling and data processing systems. They provide certain inherent advantages over electrical contact keyboards. These advantages particularly include mechanical simplicity, long life and absence of electrical signal problems caused by contact bounce and corrosion.

Such keyboards have been particularly popular in connection with smaller and less expensive information handling and data processing systems which cannot support the expense of keyboards based on Hall effect operation or other high technology approaches. However, there is an increasing demand in systems in which conventional capacitive keyboards are suitable for keyboard input devices which offer lower cost and higher performance. Furthermore, even in connection with high performance and high reliability data processing systems, there is increasing pressure for simpler and less expensive keyboard input devices.

Although capacitive keyboards have certain inherent advantages, even the most advanced existing capacitive keyboard designs have not been found totally suitable for high performance applications. One common performance shortcoming is susceptibility to malfunctions due to dust, moisture and other contaminants. Capacitive keyboards typically utilize capacitors having small capacitance values and require the detection of small changes in capacitance. In conventional devices variable capacitance is achieved with a movable conductive plate which is not totally sealed from the environment. Even minute amounts of solid contaminants between the movable plate and stationary portions of the device can prevent a full change in capacitance. In addition, foreign materials generally have a different dielectric value than the substance (normally air) intended to occupy the space between the plates. Accordingly, any contaminants between the plates have an additional effect on capacitance value. Finally, particularly in connection with capacitors formed of thin conductive layers on circuit boards and associated parts, liquid or gaseous contaminants in certain environments may adversely affect the layers and degrade the capacitors.

It is common to attempt to avoid some of these potential problems by sealing the areas over conductors and capacitor plates on printed circuit boards with coatings or layers of various types and configurations. Examples of this approach are shown in U.S. Pat. No. 3,797,630 issued to S. Zilkha on Mar. 19, 1974, U.S. Pat. No. 3,921,166 issued to J. Volpe on Nov. 18, 1975, U.S. Pat. No. 3,921,167 issued to J. Fox on Nov. 18, 1975, U.S. Pat. No. 4,163,222 issued to D. Gove on July 31, 1979 and British Pat. No. 2,027,209 published Feb. 13, 1980. However, the capacitive switch assemblies shown in each of these patents, except for British Pat. No. 2,027,209 as well as similar assemblies shown in U.S. Pat. No. 3,660,838 issued to D. Gove, et al, on May 2, 1972 and U.S. Pat. No. 3,951,250 issued to P. Pointon, et al, on Apr. 20, 1976, utilize an electrically conductive bridging element mounted on a movable plunger to vary the capacitive coupling between two fixed plates on a circuit board. Proper operation of such assemblies depends on repeatable predetermined minimum spacing between the bridging element and fixed plates when the plunger is depressed. In none of these examples is the bridging element located in an environmentally sealed area, nor would it be convenient to do so. Hence, contaminants may find their way into this area. As previously indicated, solid contaminants may prevent minimum spacing from being achieved. Contaminants of any type may affect the dielectric constant and hence the capacitance of individual capacitors.

The necessity for using a conductive bridging element in conventional capacitive circuit board apparatus arises because of the prior art circuit board design in which all of the circuit board mounted elements are fixed relative to one another. As shown in previously identified U.S. Pat. No. 3,921,167, it is known to use flexible dielectric substrates in capacitive circuit board apparatus. However, the design disclosed in that patent utilizes the flexibility characteristic to facilitate the fabrication of a two-sided circuit not requiring through-plated holes. The flexibility characteristic is further utilized to permit the circuit board to closely conform to a rigid support plate or substrate to produce a circuit board assembly which is flat within close tolerance as necessary to provide even contact and repeatable coupling characteristics with a movable conductive bridging element. Since the bridging element, which is not environmentally sealed, is part of the capacitance circuit, this design does not avoid certain of the previously identified problems.

Conversely, the applicants have utilized the characteristics of flexible circuit board substrates and two-sided circuit technology to achieve a unique capacitively coupled circuit board design which is especially simple and inexpensive to manufacture, and in which all of the capacitive elements are sealed from the environment surrounding the keyboard. Accordingly, many of the shortcomings of prior capacitively coupled keyboard apparatus are avoided.

SUMMARY OF THE INVENTION

The present invention comprises totally environmentally sealed key actuatable capacitive circuit board apparatus and a method for fabricating such apparatus in which the movable plates of an array of variable capacitors are formed on a surface of a flexible dielectric sheet which is sealed within a sandwich comprising spacer means and a further dielectric sheet carrying the fixed capacitor plates. The spacer is of a type which permits the spacing between the capacitor plates to be varied in response to force applied to the flexible dielectric sheet, and may itself comprise a sheet of material having apertures therethrough at the locations of the capacitors, the combination of the dielectric sheets and the spacer forming capacitor chambers. The capacitor chambers may be vented into expansion chamber means to relieve pressure in the capacitor chambers caused by the application of force to the flexible sheet at the locations of the capacitors. Switching hysteresis may be provided by electrically floating capacitor plates between the fixed and movable plates. The floating plates may be formed by a conductive pattern on the surface of the further dielectric sheet opposite the fixed capacitor plates.

DESCRIPTION OF THE PREFERRED EMBODIMENTS

Figure 1:
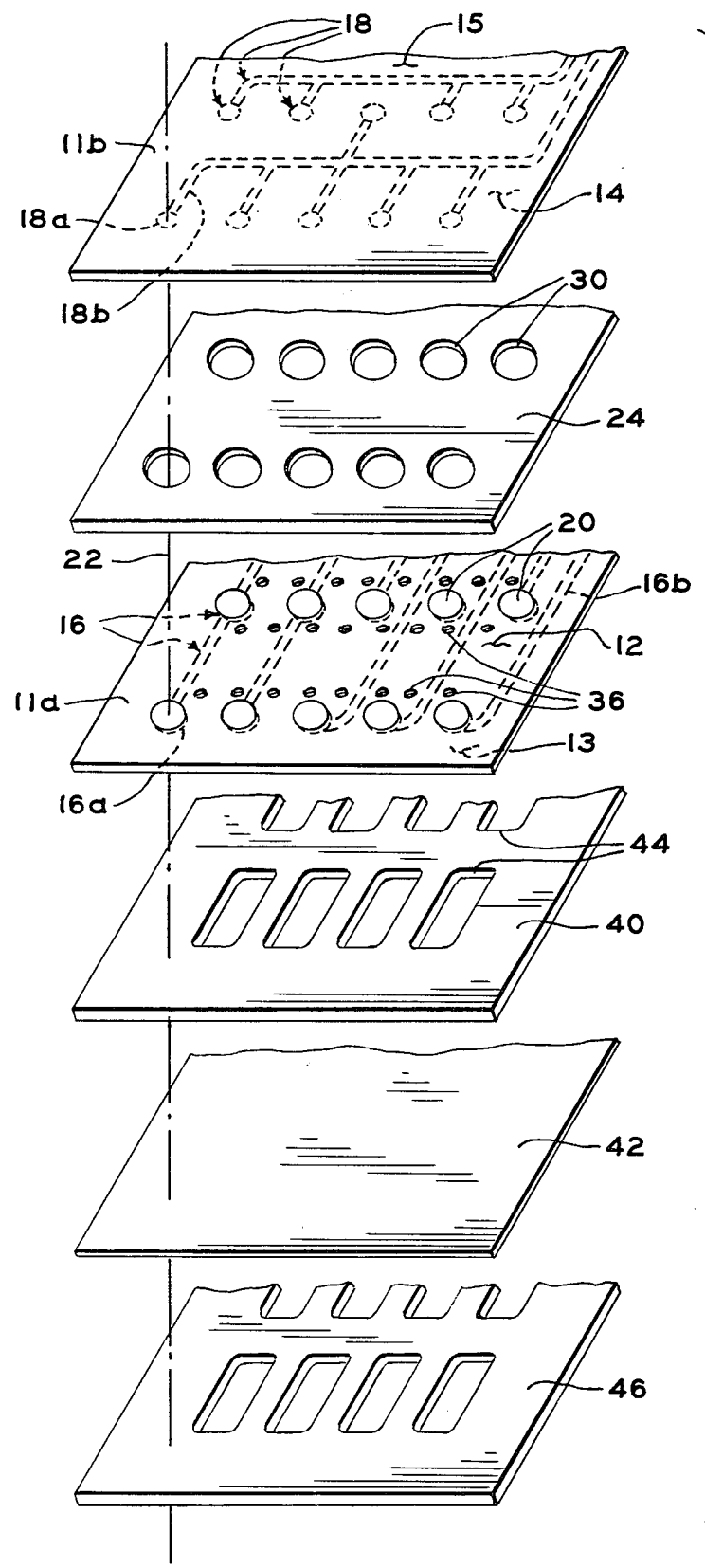
FIG. 1 is a partial exploded view of one embodiment of environmentally sealed key actuatable capacitively coupled circuit board apparatus in accordance with the applicants' invention.
Figure 2:
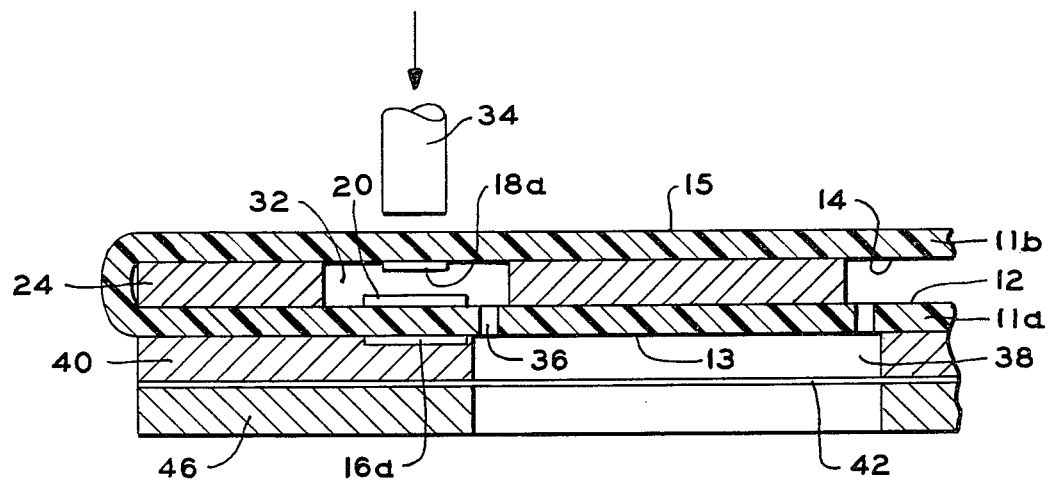
FIG. 2 is an enlarged partial cross-sectional view of the circuit board apparatus of FIG. 1.
Figure 3:
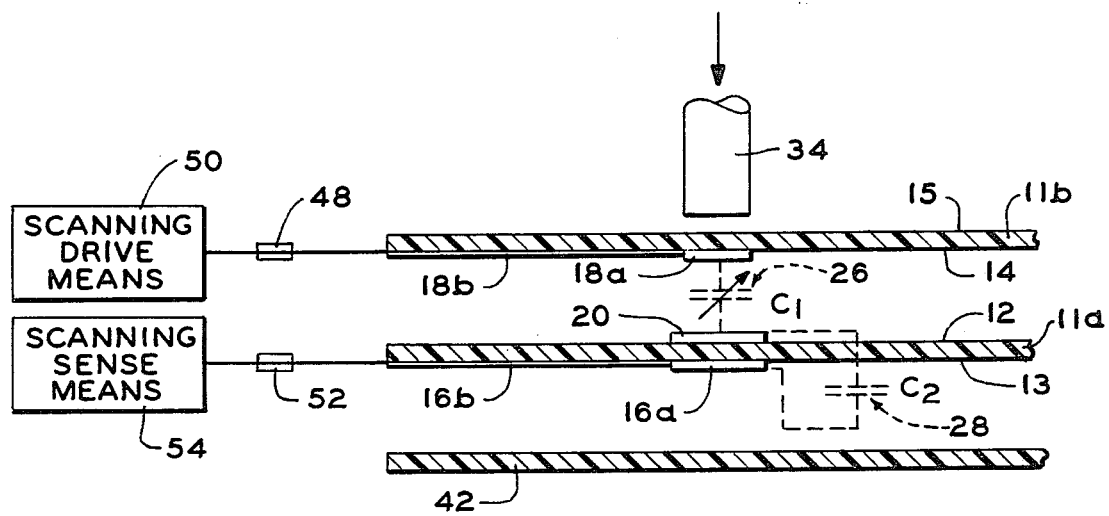
FIG. 3 is a cross-sectional schematic representation of circuit board apparatus in accordance with the applicants' invention illustrating the capacitive coupling features and drive and sense means connected thereto.

In the circuit board apparatus of FIGS. 1-3 reference numerals 11a and 11b identify flexible substrate means or dielectric sheet means which carries electrically conductive patterns forming various capacitor and electrical conductor elements. The substrate or sheet means, which may be made of Mylar (a trademark of the E. I. DuPont DeNemours Corporation) may actually be two separated sheets as illustrated in FIGS. 1 and 3, or a single sheet folded on itself as illustrated in FIG. 2 in which reference numerals 11a and 11b identify first and second portions of a single sheet. For purposes of the following description, reference numerals 11a and 11b will be assumed to refer to separate sheets with the understanding that the applicants' invention is not limited to such construction.

Sheet 11a has a first surface 12 and a second surface 13. Similarly, Sheet 11b has a first surface 14 and a second surface 15. Sheets 11a and 11b are in approximately parallel relationship with one another. First surfaces 12 and 14 are adjacent and second surfaces 13 and 15 are separated by at least the combined thickness of sheets 11a and 11b. A first pattern of conductive material or conductive area 16 is formed on surface 13 of sheet 11a. Conductive area 16 includes portions 16a which comprise fixed plates of an array of capacitors and a first plurality of conductors 16b which connect groups of the fixed capacitor plates.

A second conductive area or pattern of conductive material 18 is located on surface 14 of sheet 11b. Conductive area 18 includes an array of variable capacitor plates 18a and a second plurality of conductors 18b which connect groups of the variable capacitor plates. Capacitor plates 16a and 18a are arranged in substantially identical patterns with substantially identical spacing.

A third conductive area or pattern of conductive material 20 is located on surface 12 of sheet 11a. Conductive area 20 comprises an array of capacitor plates aligned with capacitor plates 16a in a direction perpendicular to the surfaces of sheet 11a as represented by axis 22. Capacitor plates 20 are electrically insulated from one another and are not connected to any other electronic circuitry. Accordingly, capacitor plates 20 normally float electrically.

First spacer means 24 is interposed between surfaces 12 and 14 of sheets 11a and 11b respectively. The sheets and spacer are sandwiched together with sheet 11b being positioned so that capacitor plates 18a are aligned with capacitor plates 16a and 20 in a direction perpendicular to the surfaces of sheets 11a and 11b. Accordingly, as illustrated in FIG. 3, there is a first capacitance 26 between capacitor plates 18a and 20. As will be more fully described hereinafter, capacitance 26 is variable. Similarly, as illustrated in FIG. 3 there is a second fixed capacitance 28 between capacitor plates 16a and 20.

Sheets 11a and 11b and spacer means 24 are sealed together so as to prevent exposure of surfaces 12 and 14 and the capacitors between surfaces 12 and 14 to the environment surrounding the capacitive circuit board assembly. Spacer means 24 is designed to normally maintain a predetermined spacing between capacitor plates 18a and 20, but to permit the separation between the capacitor plates to be varied by the application of force to flexible sheet 11b at the locations of the capacitors. As illustrated in FIGS. 1 and 2, spacer means 24 has apertures 30 therethrough which are located in alignment with the capacitor plates. Sheets 11a and 11b in combination with spacer means 24 form an array of capacitor chambers 32 of which at least the chamber wall formed by sheet 11b is flexible so as to permit spacing between capacitor plates 18a and 20 to be varied. The force for varying the spacing between the capacitor plates may be applied by means of an array of plungers identified in FIGS. 2 and 3 by reference numeral 34 which may comprise portions of a keyboard (not shown).

Spacer means 24 is illustrated as a sheet of self-supporting material which may be bonded between surfaces 12 and 14. Alternatively, spacer means 24 may comprise a layer of adhesive of predetermined thickness applied between the surfaces and allowed to cure. In order to ensure that pressure within capacitor chambers 32 caused by depression of sheet 11b by plunger 34 does not interfere with proper operation of the variable capacitor, the capacitance chambers are shown vented through apertures 36 in sheet 11a. To maintain the environmentally sealed condition, the capacitor chambers are vented into sealed expansion chamber means identified by reference numeral 38 in FIG. 2. As shown, apertures 36 provide fluid communication between the capacitor chambers and the expansion chamber means.

Expansion chamber means 38 is formed in a second spacer means 40 bonded between surface 13 and a flexible film 42. As can be seen from FIG. 1, as many as four capacitor chambers are vented into one expansion chamber. The expansion chambers are formed by apertures 44 through spacer means 40. A third spacer means 46 is fixed on the side of film 42 opposite spacer means 40. Spacer means 46 has apertures therethrough corresponding to the apertures through spacer means 40. Spacer means 46 is provided to ensure that flexible film 42 covering the expansion chambers will be permitted to flex as necessary to provide pressure relief when the capacitive circuit board is mounted directly on a flat surface.

First and second pluralities of conductors 16b and 18b form a crosspoint matrix of conductors, with each capacitor being connected to a unique pair of conductors comprising one conductor from each of the first and second pluralities of conductors. One of the pluralities of conductors is connected through a connector identified by reference numeral 48 to a scanning drive signal source or drive signal means 50 which sequentially supplies a drive signal to individual conductors. The other plurality of conductors is connected through a connector 52 to a scanning sense circuit or sense means 54 which sequentially senses signals on individual conductors.

Operations of the drive signal source and sense circuit are coordinately timed so that once during every scanning cycle the drive source and sensing circuit simultaneously address each capacitor in the array. If any keyboard key is actuated during the scanning cycle, the plunger on that key causes the spacing between the plates of the associated capacitor to be reduced, thus inceasing the capacitive coupling between the appropriate drive and sense conductors. Accordingly, once every scanning cycle the state of actuation of every capacitor in the array is detected. Reference may be made to copending application Ser. No. 258,248 filed Apr. 28, 1981 in the name of T. Chai and the patents referenced therein for a complete description of the operation of scanning drive and sense means suitable for use in the present invention.

The function of floating capacitor plates 20 is to provide hysteresis and a fixed predetermined maximum capacitance, thereby increasing the reliability of capacitance switching. In operation, as plate 18a of any capacitor is moved toward the other capacitor plates, the capacitive coupling gradually increases. At some point in the movement of plate 18a the capacitive coupling becomessufficiently great to cause sense means 54 to detect actuation of the key associated with the capacitor. However, it is desirable that during the time a key is actuated the capacitive coupling be substantially greater than that necessary to achieve threshold detection. Accordingly, as plate 18a is moved, it eventually comes into electrical contact with plate 20. Plate 20 is sized to have a larger area than plate 18a. When electrical contact is made there is a step increase in capacitive coupling, thereby ensuring positive detection of key actuation. The maximum capacitive coupling is, however, limited by the fixed spacing between capacitor plates 16a and 20. This provision of a predetermined maximum capacitive coupling further ensures reliable detection of key actuations. A further advantage of sizing plate 18a smaller than plate 20 is that such a relationship eliminates the need for exact registration of plates 18a and 20 and exact positioning of sheets 11a and 11b.

In accordance with the foregoing description, the applicants have provided a unique capacitively coupled circuit board design and fabrication method which achieves the advantages of total environmental sealing, self-contained provision for hysteresis, exceptional compactness and exceptionally simple design requiring only elementary printed circuit board fabrication techniques without the necessity for plated-through holes. Although a particular embodiment has been shown and described for illustrative purposes, a number of variations and modifications will be apparent to those familiar with the relevant arts. It is intended that coverage of the invention not be limited to the embodiment shown, but only by the terms of the following claims.

The embodiments of the invention in which an exclusive property or right is claimed are defined as follows:

1. A key actuatable capacitive circuit board comprising:
    flexible dielectric sheet means having first and second parallel proximate portions each with first and second surfaces arranged so that the first surfaces are adjacent and the second surfaces are separated by at least the first and second portions;
    first and second patterns of electrically conductive material on the first surface of the first portion of said sheet means and the second surface of the second portion of said sheet means respectively, selected portions of said first and second patterns being aligned in a direction perpendicular to the portions of said sheet means so as to form first and second plates of an array of capacitors;
    first spacer means interposed between the first surfaces of the first and second portions of said sheet means so as to normally maintain a predetermined separation between the first surfaces, said spacer means being of a design which permits the spacing between the first and second plates of capacitors in the array to be varied; and
    sealing means for sealing the first and second portions of said sheet means and said first spacer means together so as to prevent exposure of the spaces between the first and second capacitor plates to the environment surrounding said sheet means.

2. The capacitive circuit board of claim 1 further comprising a third pattern of electrically conductive material on the first surface of the second portion of said sheet means, said third pattern being configured and located so as to form third plates of the array of capacitors, each capacitor having a variable capacitance between its first and third plates in series with a fixed capacitance between its second and third plates.

3. The capacitive circuit board of claim 1 or 2 in which said first spacer means has apertures therethrough at the locations of the capacitors in the array so as to form capacitor chambers of which at least the chamber wall carrying the first capacitor plate is flexible to permit the spacing between plates in the capacitors to be varied in response to force applied to the first portion of said sheet means at the locations of the capacitors.

4. The capacitive circuit board of claim 3 wherein said sealing means includes venting means for relieving pressure in the capacitor chambers caused by application of force to the first portion of said sheet means at the locations of the capacitors.

5. The capacitive circuit board of claim 4 wherein said venting means comprises sealed expansion chamber means and passages through the second portion of said sheet means to provide fluid communication between the capacitor chambers and the expansion chamber means.

6. The capacitive circuit board of claim 5 wherein said sealed expansion chamber means is formed by:
    a flexible film; and
    second spacer means having apertures therethrough sealed between the second surface of the second portion of said sheet means and said flexible film.

7. The capacitive circuit board of claim 1 or 2 wherein portions of said first and second patterns form first and second pluralities of conductors respectively arranged in a crosspoint matrix, the first and second pluralities of conductors being connected to the first and second plates of the capacitors in the array so that each capacitor is connected to a unique pair of conductors.

8. The capacitive circuit board of claim 7 further including keyboard actuator means for selectively applying force to the first portion of said sheet means at the locations of the capacitors to vary the capacitances of selected capacitors in the array.

9. The capacitive circuit board of claim 7 further including:
    scanning drive means for sequentially supplying a drive signal to individual conductors of one of said first and second pluralities of conductors; and
    scanning sense means for sequentially sensing signals on individual conductors in the other of said first and second pluralities of conductors to detect the actuation state of capacitors in the array.

10. The capacitive circuit board of claim 2 wherein the first capacitor plates have smaller areas than the second and third capacitor plates.

11. A method of fabricating a key actuatable capacitive circuit board comprising the steps of:
providing a sheet of flexible dielectric material having first and second surfaces which when folded on itself forms a circuit board of double thickness having the size and shape desired for the circuit board;
applying a first pattern of electrically conductive material to the first surface of said sheet within a first field covering less than one-half of the sheet, portions of the first pattern being configured to form first plates of an array of capacitors;
applying a second pattern of electrically conductive material to the second surface of said sheet within a second field not overlapping the first field, portions of the second pattern being configured to form second plates of an array of capacitors having spacing substantially identical to the spacing of the first plates and being located so that when the sheet is folded on itself the first and second plates are aligned in a direction perpendicular to the sheet;
folding the sheet on itself so that the first plates are aligned with the second plates in a direction perpendicular to the sheet;
providing first spacer means between the portions of the sheet folded on itself, said spacer means being of a design which permits the spacing between corresponding first and second plates to be varied;
sealing the portions of the sheet folded on itself and the spacer means together so as to prevent exposure of the spaces between the first and second capacitor plates to the environment surrounding the circuit board.

12. The method of claim 11 comprising the further step of applying a third pattern of electrically conductive material to the first surface of the sheet within the field of the second pattern, the third pattern being configured and located to form third plates of the array of capacitors, whereby each capacitor has a variable capacitance between its first and third plates and a fixed capacitance between its second and third plates.

13. The method of claim 12 including the further steps of:
forming apertures through the flexible sheet within the second field, said apertures opening into spaces between the first and third capacitor plates;
providing second spacer means having apertures therethrough, the apertures being arranged and spaced to correspond with the apertures through the flexible sheet;
providing a flexible film; and
sealing the second spacer means between the film and the sheet to form sealed expansion chamber means in fluid communication with the spaces between the first and third capacitor plates.

14. Capacitively coupled apparatus comprising:
a first sheet of dielectric material having first and second electrically conductive areas on opposite surfaces thereof, at least portions of the conductive areas being aligned along a first axis perpendicular to the surfaces so as to form at least one fixed capacitor between corresponding conductive areas on opposite surfaces;
a second flexible sheet of dielectric material having third electrically conductive areas on a first surface thereof, the conductive areas on said second sheet being arranged and said first and second sheets being positioned so that the first surfaces thereof are in a proximate spaced relationship and so that the conductive areas thereon are at least partially aligned along the first axis;
spacer means located between the first surfaces of said first and second sheets so as to permit the spacing between corresponding conductive areas on the first surfaces to be varied, thereby forming at least one variable capacitor between conductive areas on the first surfaces of said first and second sheets; and,
sealing means including means for fixing said first and second sheets and said spacer means together so as to seal the first surfaces of said first and second sheets from exposure to the environment surrounding the sheets.

15. The apparatus of claim 14 wherein said spacer means comprises a third sheet of material having at least one aperture therethrough at the location of the variable capacitor whereby said first and second sheets and said spacer means form a capacitor chamber, the wall of which formed by said second sheet is flexible so as to permit the spacing between the plates of the variable capacitor to be varied.

16. The apparatus of claim 15 further including:
a sealed expansion chamber; and
vent aperture means through said first sheet for providing communication between the capacitor chamber and the expansion chamber so as to relieve pressure in the capacitor chamber caused by the application of force to the second sheet to vary the capacitance of the variable capacitor.

17. The apparatus of claim 16 wherein said sealed expansion chamber is formed by:
second spacer means having at least one aperture therethrough with a first side bonded to the second surface of said first sheet; and
a flexible film bonded to a second side of said second spacer so as to provide a sealed chamber.

18. The apparatus of claim 17 further including a protective backing bonded to said flexible film and having at least one aperture therethrough at the area of said sealed expansion chamber so as to ensure space for movement of said flexible film.

19. The apparatus of claim 14 wherein the first and third conductive areas form an array of capacitors and a crosspoint matrix of first and second pluralities of conductors, each capacitor being connected to a unique pair of conductors comprising one conductor from each of the first and second pluralities of conductors.

20. The apparatus of claim 16 wherein:
the first and third conductive areas form an array of capacitors and a crosspoint matrix of first and second pluralities of conductors, each capacitor being connected to a unique pair of conductors comprising one conductor from each of the first and second pairs of conductors;
a capacitor chamber is associated with each capacitor;
sealed expansion chamber means is provided; and
said vent aperture means includes at least one vent aperture through said first sheet between each capacitor chamber and said sealed expansion chamber means.

21. The apparatus of claim 19 or 20 further including:
scanning drive means for sequentially supplying a drive signal to individual conductors of the second plurality of conductors; and
scanning sense means for sequentially sensing signals on individual conductors of the first plurality of conductors to detect the state of the individual capacitors in the array.

22. The apparatus of claim 21 further including key actuation means for selectively varying the capacitance of variable capacitors in the array.

23. Environmentally sealed variable capacitance apparatus comprising:
a first sheet of dielectric material of a predetermined thickness having first and second surfaces thereon;
a first electrically conductive pattern formed on the first surface of said first sheet, at least a portion of said first pattern comprising a first capacitor plate;
a second electrically conductive pattern formed on the second surface of said first sheet, at least a portion of said second pattern comprising a second capacitor plate which is electrically insulated from the remainder of said second pattern and located in at least partial alignment with the first capacitor plate in a direction perpendicular to the first and second surfaces of said first sheet so as to provide a first fixed capacitor between the first and second capacitor plates;
a second flexible sheet of dielectric material having a first surface thereon;
a third electrically conductive pattern formed on the first surface of said second sheet, at least a portion of the third pattern forming a third capacitor plate; and
first spacer means interposed between the second surface of said first sheet of dielectric material and the first surface of said second sheet of dielectric material so as to normally maintain the surfaces in a spaced parallel relationship so that the portion of said third pattern forming the third capacitor plate is in at least partial alignment with the first and second capacitor plates in a direction perpendicular to the surfaces of said first and second sheets, said spacer means having apertures therethrough to permit the spacing between the second and third capacitor plates to be varied, the second surface of said first sheet, the first surface of said second sheet and said first spacer means being environmentally sealed together to prevent exposure of the surfaces to the environment surrounding said first and second sheets.

* * * * *